United States Patent [19]
Park et al.

[11] Patent Number: 6,019,843
[45] Date of Patent: Feb. 1, 2000

[54] APPARATUS FOR COATING A SEMICONDUCTOR WAFER WITH A PHOTORESIST

[75] Inventors: Sung-hyeon Park, Suwon; Sung-il Kim, Seoul, both of Rep. of Korea

[73] Assignee: Samsung Electronics Co., Ltd., Suwon, Rep. of Korea

[21] Appl. No.: 09/019,118

[22] Filed: Feb. 5, 1998

[30] Foreign Application Priority Data

Feb. 28, 1997 [KR] Rep. of Korea ................. 97-6793

[51] Int. Cl.[7] ...................................................... B05C 5/00

[52] U.S. Cl. ........................... 118/52; 118/319; 118/320; 118/70; 134/153; 134/157; 134/175; 134/200; 134/902

[58] Field of Search ............................. 118/52, 319, 320, 118/70; 134/902, 151, 153, 157, 175, 198, 200

[56] References Cited

U.S. PATENT DOCUMENTS

| | | | |
|---|---|---|---|
| 5,565,034 | 10/1996 | Nanbu et al. | 118/52 |
| 5,591,262 | 1/1997 | Sogo et al. | 118/52 |
| 5,762,708 | 6/1998 | Motoda et al. | 118/52 |

*Primary Examiner*—Laura Edwards
*Attorney, Agent, or Firm*—Jones Volentine, LLP

[57] ABSTRACT

An apparatus coats a semiconductor wafer with photoresist that is to be etched in the manufacture of the semiconductor. The apparatus includes a body having an open top, a spin chuck for revolving a wafer fixed thereon at a uniform rate, a bowl for preventing photoresist from spattering on the body and which is installed inside the body, a photoresist dispensing nozzle for spraying photoresist on the wafer, a side rinse nozzle for removing photoresist adhered to the peripheral edge of the wafer, a cover for opening/closing the top of the body, and a cleaning device associated with the cover for cleaning the bowl. The apparatus allows the bowl to be cleaned while the cover is closed and the bowl is still disposed inside the body. The cleaning device includes a sprinkler and a pump.

3 Claims, 4 Drawing Sheets

APPARATUS FOR COATING A SEMICONDUCTOR WAFER WITH A PHOTORESIST

BACKGROUND OF THE INVENTION

1. Field of the Invention

The present invention relates to an apparatus for coating a wafer with a photoresist in the manufacture of a semiconductor device, and more particularly, to an apparatus for coating a wafer with a photoresist that is to be etched in the manufacture of the semiconductor device.

2. Description of the Related Art

Generally, an apparatus for coating a wafer with a photoresist, as shown in FIG. 1, comprises an outer body 1 having an open top, and a spin chuck 2 loaded with a wafer W and disposed inside the outer body 1. The spin chuck 2, which is integrated with and driven by a driving part 3, penetrates the bottom of the outer body 1 and revolves to rotate the wafer W fixed thereon.

The outer body 1 has a bowl-like shape and its top is located above the spin chuck 2 to prevent photoresist from being spattered out of the outer body 1 during the photoresist coating operation. A photoresist dispensing nozzle 4 and a side rinse nozzle 5 are installed on the top of the outer body 1. These nozzles 4, 5 move up and down relative to the wafer.

An inner bowl 6 is installed within the outer body 1 to prevent photoresist from spattering on the outer body 1. The bowl 6 is made of a heat resistant, scratch resistant, non-stick material (e.g., TEFLON) so that any photoresist existing on the surface of the outer body 1 can be removed easily. The inner bowl 6 must be changed regularly for cleaning.

The wafer W placed on the spin chuck 2 of the outer body 1 is fixed thereto by a vacuum created by the spin chuck 2, and then the photoresist dispensing nozzle 4 and the side rinse nozzle 5 move downward to apply photoresist to the wafer. At the same time, the spin chuck 2 driven by the driving part 3 revolves at a constant rate and photoresist is sprayed on the wafer surface and spread uniformly thereover by centrifugal force.

The rinse solution supplied from the side rinse nozzle 5 removes any photoresist adhered to the peripheral edge of the wafer, and the rinse solution and the removed photoresist are drained through an outlet 7 of the inner bowl 6.

After the entire surface of the wafer is coated with photoresist, the photoresist dispensing nozzle 4 and the side rinse nozzle 5 move upwards, the spin chuck 2 stops revolving, and the wafer having the photoresist thereon is transferred to the next processing station.

However, the cleaning of the conventional apparatus requires changing the inner bowl 6. This takes much time and the inconvenience significantly affects the production rate of the facility.

Further, since the photoresist supplied from the photoresist dispensing nozzle 4 is exposed to the atmosphere during the coating process and the solvent element of the photoresist is volatilized, its viscosity is increased. Thus, the photoresist is not uniformly coated on the wafer. The uniformity of the photoresist layer is critical to prevent difficulties downstream in manufacturing a semiconductor device having precise dimensions.

SUMMARY OF THE INVENTION

An object of the present invention is to provide an apparatus for coating a wafer with a photoresist which substantially overcomes one or more of the problems, limitations and disadvantages of the related art.

More specifically, a first object of the present invention is to increase the efficiency of the coating process and the operation rate of the semiconductor manufacturing facility by making it possible to clean the apparatus without removing the inner bowl from the outer body of the photoresist coating apparatus.

Another object of the present invention is to provide a photoresist coating apparatus which prevents the photoresist from being exposed to the atmosphere and which maintains the viscosity of the photoresist, so that a precise and uniform layer of photoresist may be obtained.

To achieve these and other objects and advantages the present invention provides a photoresist coating apparatus including a body having an open top, a spin chuck for revolving a wafer at a uniform rate, a bowl for preventing photoresist from spattering on the body and which is installed inside the body, a photoresist dispensing nozzle for spraying photoresist on the wafer, a side rinse nozzle for removing photoresist adhered to the peripheral edge of the wafer, the photoresist dispensing nozzle and the side rinse nozzle being movable up and down in a vertical direction relative to the wafer, a cover for opening/closing the top of the body, and a cleaning device associated with the cover for cleaning the bowl.

In one embodiment, the cover is pivotably mounted to the body, and the photoresist dispensing nozzle and the side rinse nozzle are fixed to the cover so as to become positioned over the wafer when the cover is closed.

The cleaning device includes a sprinkler for spraying a rinse solution onto the bowl, and a pump for supplying the rinse solution from a rinsing tank to the sprinkler.

BRIEF DESCRIPTION OF THE DRAWINGS

These and other features and advantages will be described with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
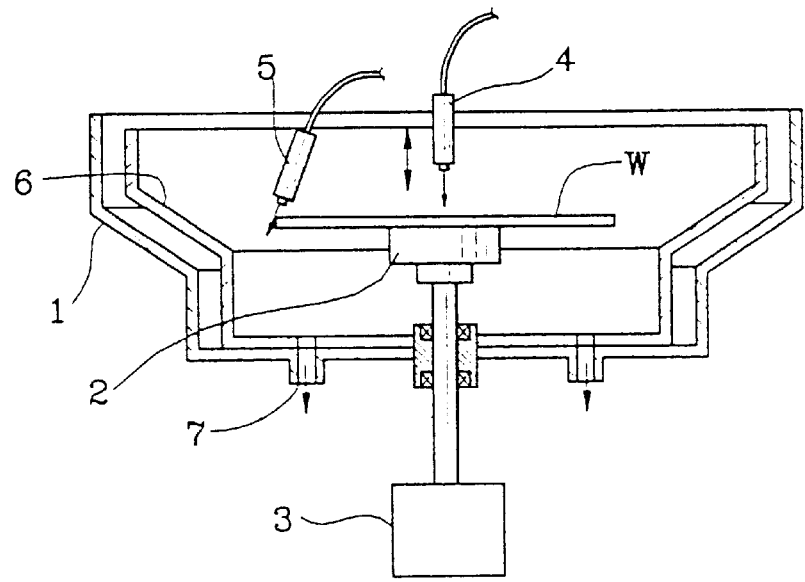
FIG. 1 is a cross-sectional view of a conventional photoresist coating apparatus.
Figure 2:
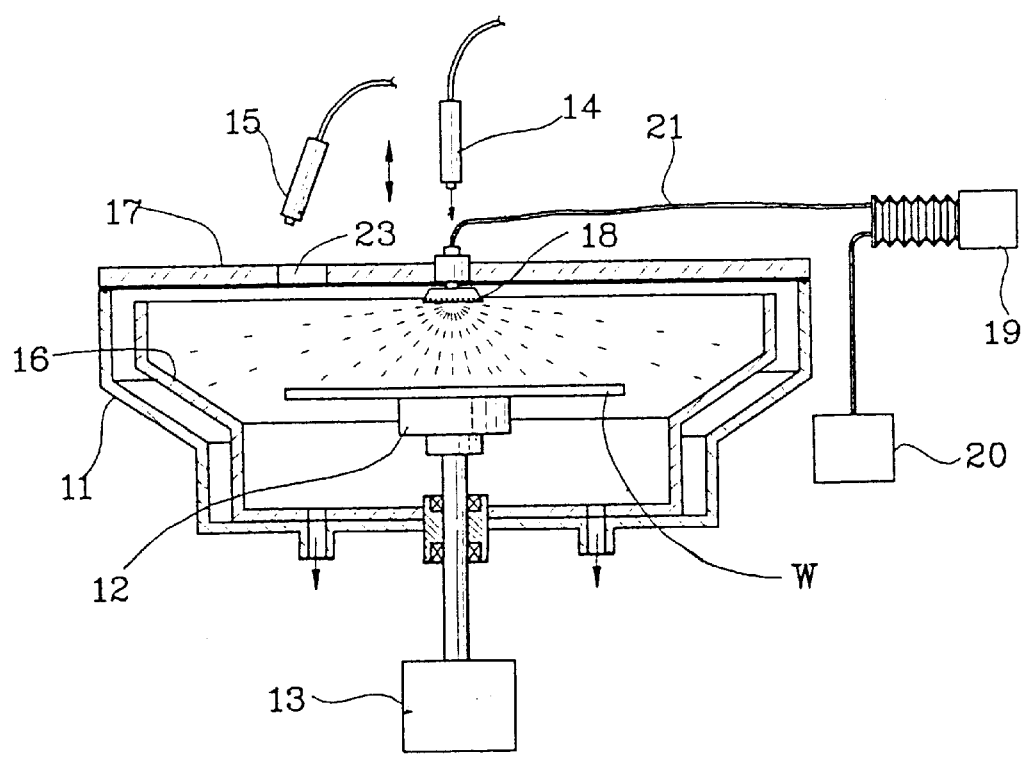
FIG. 2 and FIG. 3 are cross-sectional views of one embodiment of a photoresist coating apparatus according to the present invention.
Figure 4:
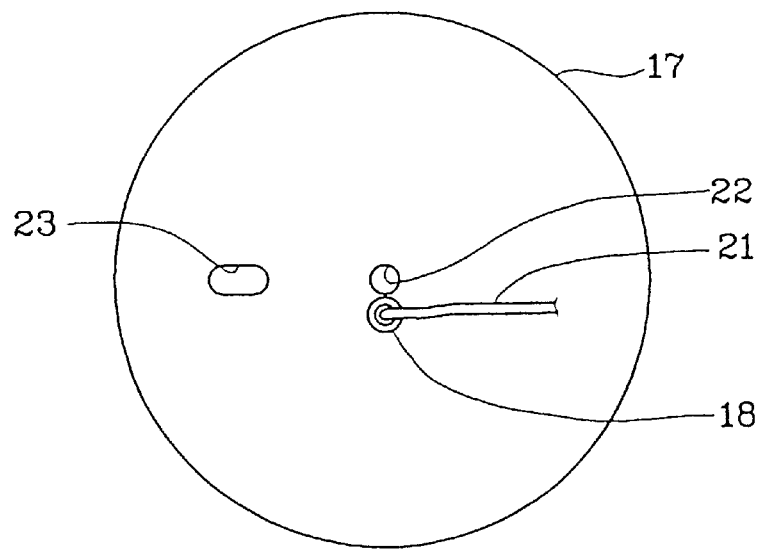
FIG. 4 is a plan view of a cover of the photoresist coating apparatus according to the present invention.

FIG. 2 and FIG. 4 show one embodiment of the apparatus for coating a wafer with a photoresist according to the present invention, wherein the apparatus comprises an outer body 11 whose top is open, and a spin chuck 12 which is installed inside the body 11 and is loaded with a wafer W.

The body 11 is made of stainless steel and has an inner bowl 16 disposed inside to prevent photoresist from spattering on the body 11. The bowl 16 is made of a heat resistant, scratch resistant, non-stick material such as TEFLON so that it is easy to clean.

The spin chuck 12 penetrates the bottom of the body 11 and is revolved at a uniform rate by the driving part 13. Wafers W are fixed to the chuck 12 by a vacuum produced by the chuck itself.

In addition, the body 11 of the coating apparatus has a cover 17. The cover 17 includes a cleaning means to remove the photoresist from the bowl 16. The cleaning means comprises a sprinkler 18 which is installed to spray a rinse solution onto the bowl 16, and a pump 19 connected to a rinse tank 20 and to a flexible hose 21 for pumping the rinse solution to the sprinkler 18. The pump 19 and the sprinkler 18 are connected to each other through the hose 21. The hose 21 is flexible enough to move easily during the opening/closing of the cover 17. Preferably, the rinse solution is a solvent.

The top of the cover 17 also has openings 22 and 23 for respectively receiving a photoresist dispensing nozzle 14 for coating the wafer on the spin chuck 12 with photoresist, and a side rinse nozzle 15 for removing the photoresist from the peripheral edge of the wafer. Both of the nozzles 14,15 are supported in the apparatus so as to be free to move up and down in a vertical direction relative to the wafer W. The openings 22, 23 extend through the cover 17 to allow the photoresist dispensing nozzle 14 and the side rinse nozzle 15 to penetrate the cover 17.

In operation, the cover 17 covering the top of the body 11 is opened, and the wafer to be coated with photoresist is fixed on the spin chuck 12. Then, the cover 17 is closed to seal the inside of the body 11 from the external atmosphere as shown in FIG. 2.

Figure 3:
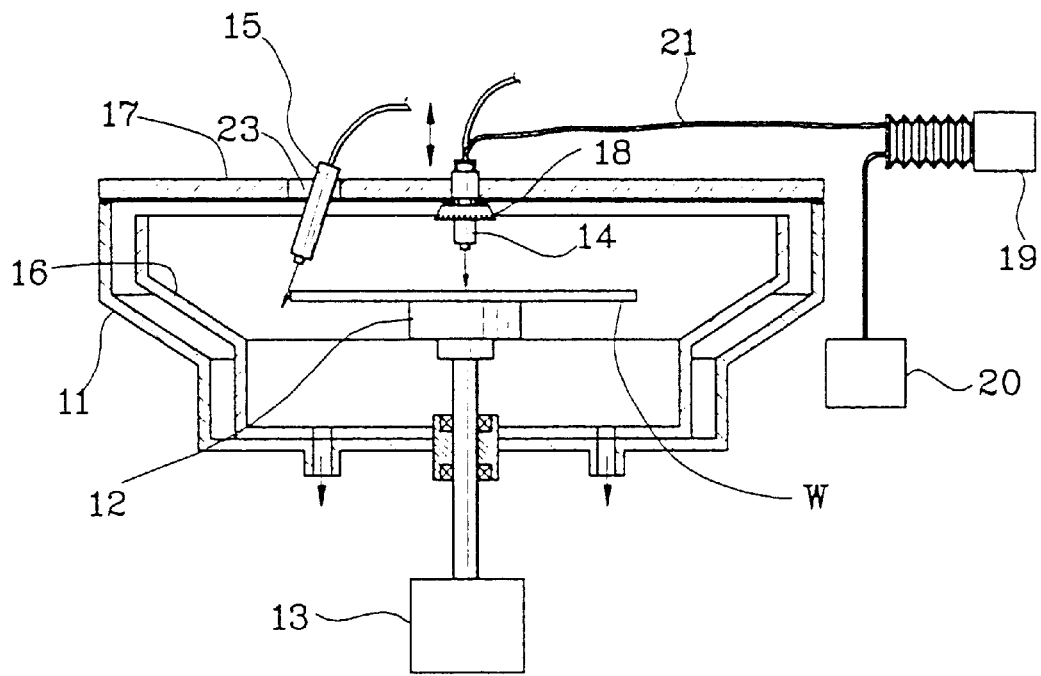

Next, the photoresist dispensing nozzle 14 and the side rinse nozzle 15 are inserted downward into the body 11 through the holes 22, 23 as shown in FIG. 3. The photoresist is sprayed from the photoresist dispensing nozzle 14 as the spin chuck 12 is driven by the driving part 13 so that the surface of the wafer is uniformly coated with photoresist by centrifugal force. Here, the photoresist spattered on the peripheral edge of the wafer is removed by the rinse solution sprayed from the side rinse nozzle 15.

When the coating operation is completed, the photoresist dispensing nozzle 14 and the side rinse nozzle 15 are drawn upward and at the same time, the wafer W coated with photoresist is withdrawn through the opened cover 17 and is transferred to the next processing station. Another wafer is then fixed on the spin chuck 12, the cover 17 is closed, and the photoresist coating operation begins again.

The cover 17 of the photoresist coating apparatus of the present invention reduces the probability that the photoresist will come into contact with the external atmosphere and a volatile solvent of the photoresist will be volatilized. In addition, the cover allows the bowl 16 to be cleaned without it being separated from the body 11. Specifically, the cleaning operation is performed with the cover 17 closed and a dummy wafer is fixed on the spin chuck 12 inside the body 11. Using pump 19, the rinse solution is supplied from the rinse tank 20 to the flexible hose 21 and then to the sprinkler 18. The rinse solution is sprayed onto the bowl 16 and thereafter drained through an outlet at the bottom.

Figure 5:
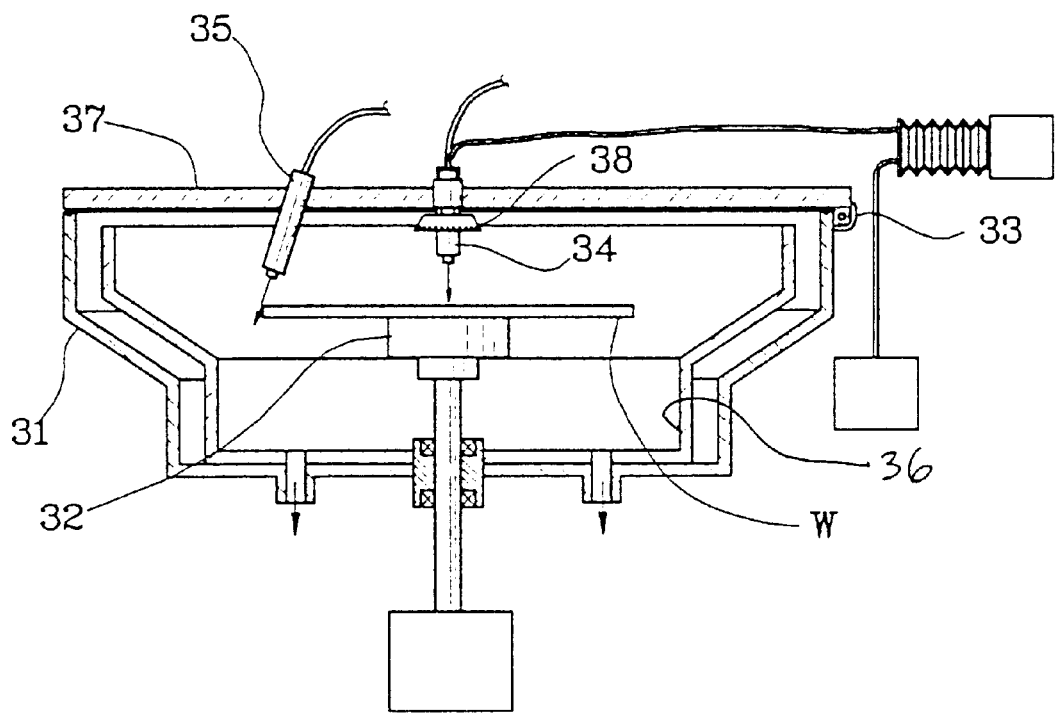
FIG. 5 and FIG. 6 are cross-sectional views of another embodiment of a photoresist coating apparatus according to the present invention.
Figure 7:
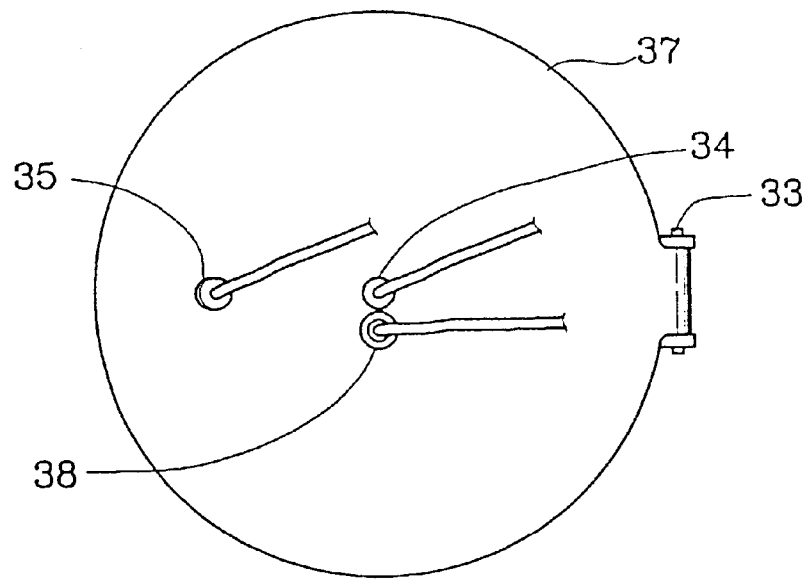
FIG. 7 is a plan view of a cover of the photoresist coating apparatus of the present invention shown in FIG. 5 and FIG. 6.

FIG. 5 and FIG. 7 show another embodiment of the coating apparatus according to the present invention, wherein a photoresist dispensing nozzle 34 and a side rinse nozzle 35 are fixed to a cover 37 along with a sprinkler 38. Furthermore, this embodiment further comprises a rod 33 extending axially along an upper portion of the body 31. The cover 37 is mounted on the rod 33 such that the cover is pivotable about the longitudinal axis of the rod. The rod 33 functions as a hinge pin, and the cover 37 is pivotable between opened and closed positions about the hinge pin.

Figure 6:
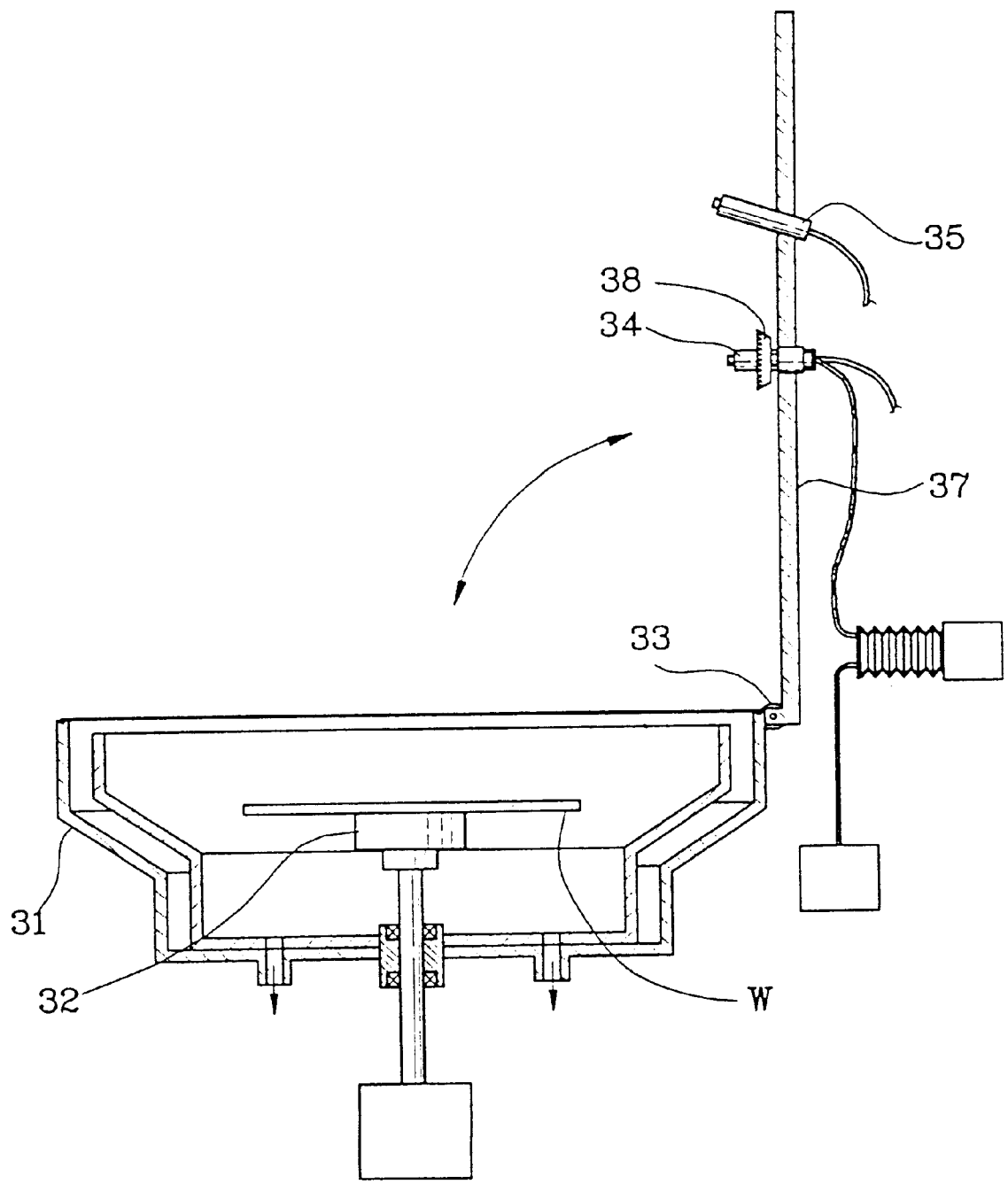

In this apparatus, the cover 37 is pivoted to an open position, and a wafer W is fixed on the spin chuck 32. Then, the cover 37 is closed, which brings the photoresist dispensing nozzle 34 and side rinse nozzle 35 in close proximity to the wafer W. Next, the photoresist coating operation and the removal of the photoresist from the peripheral edge of the wafer are performed. When the cover is opened after the photoresist coating operation is completed (FIG. 6), the photoresist dispensing nozzle 34 and the side rinse nozzle 35 are moved away from the wafer so that the wafer can be transferred to the next processing station.

The cleaning of the inner bowl 36 would be carried out in a manner similar to the previous embodiment with the cover 17 being closed.

As described above, the photoresist dispensing nozzle 34 and the side rinse nozzle 35 are fixed to the cover 37 which is movable between open and closed positions. This eliminates the need for a device to move the photoresist dispensing nozzle 34 and the side rinse nozzle 35 up and down vertically relative to the wafer.

It will be apparent to those skilled in the art that various modifications and variations of the present invention can be made without departing from the spirit or scope of the invention. Thus, all such modifications and variations which fall within the scope of the appended claims are seen to be within the true spirit and scope of the present invention.

We claim:

1. An apparatus for coating a semiconductor wafer with photoresist, said apparatus comprising:

a body having an open top;

a spin chuck disposed inside said body and mounted so as to be revolvable relative to said body;

a bowl disposed inside said body and configured to prevent photoresist from spattering on said body;

a cover which is openable and closable over the top of said body;

photoresist dispensing means, fixed to said cover, for spraying photoresist on the wafer mounted on said spin chuck when said cover is closed;

side rinsing means, fixed to said cover, for spraying photoresist adhered to a peripheral edge of a wafer chucked by said spin chuck when said cover is closed;

cleaning means, mounted to said cover, for cleaning said bowl; and a rod extending axially along an upper portion of said body said cover being mounted to said rod so as to be pivotable about a longitudinal axis thereof.

2. The apparatus as claimed in claim 1, wherein said cleaning means comprises a sprinkler fixed to a middle portion of the cover, and a pump connected to said sprinkler.

3. The apparatus as claimed in claim 1, further comprising a rinse tank filled with a solvent, and wherein said pump connects said sprinkler and said rinse tank so as to pump the solvent to said sprinkler.

* * * * *